(12) United States Patent
Hariharan et al.

(10) Patent No.: US 9,341,668 B1
(45) Date of Patent: May 17, 2016

(54) INTEGRATED CIRCUIT PACKAGE TESTING

(71) Applicant: Xilinx, Inc., San Jose, CA (US)

(72) Inventors: Ganesh Hariharan, Santa Clara, CA (US); Raghunandan Chaware, Sunnyvale, CA (US); Glenn O'Rourke, Gilroy, CA (US); Inderjit Singh, Saratoga, CA (US); Eric J. Thorne, Santa Cruz, CA (US); David E. Schweigler, Copperopolis, CA (US)

(73) Assignee: XILNIX, INC., San Jose, CA (US)

( * ) Notice: Subject to any disclaimer, the term of this patent is extended or adjusted under 35 U.S.C. 154(b) by 108 days.

(21) Appl. No.: 14/242,760

(22) Filed: Apr. 1, 2014

(51) Int. Cl.
*G01R 31/00* (2006.01)
*G01R 31/26* (2014.01)
*G01R 1/04* (2006.01)

(52) U.S. Cl.
CPC .............. *G01R 31/26* (2013.01); *G01R 1/0416* (2013.01)

(58) Field of Classification Search
CPC ............ G01R 31/2886; G01L 25/0652; G01L 25/0657; G06F 1/16; G06F 1/324
See application file for complete search history.

(56) References Cited

U.S. PATENT DOCUMENTS

| | | | | | |
|---|---|---|---|---|---|
| 5,576,630 | A | * | 11/1996 | Fujita | G01R 31/2886 324/754.07 |
| 5,808,474 | A | * | 9/1998 | Hively | G01R 1/0483 324/756.02 |
| 7,068,059 | B2 | * | 6/2006 | Hanke | G01R 1/0483 324/754.07 |
| 8,823,166 | B2 | * | 9/2014 | Lin | H01L 24/11 257/737 |
| 2014/0312483 | A1 | * | 10/2014 | Vo | H01L 25/0652 257/691 |

* cited by examiner

*Primary Examiner* — Minh N Tang
(74) *Attorney, Agent, or Firm* — LeRoy D. Maunu

(57) ABSTRACT

A testable circuit arrangement includes an integrated circuit (IC) package. The IC package includes a package substrate, an interposer mounted directly on the package substrate with level 1 interconnects, and at least one IC die mounted directly on the interposer with level 0 interconnects. The package substrate of the IC package is mounted directly on a connector board with a soldered ball grid array of level 2 interconnects. The level 0, level 1, and level 2 interconnects include respective power, configuration, and test interconnects. Power, configuration, and test terminals of the connector board are coupled to the power, configuration, and test interconnects of the level 2 interconnects.

18 Claims, 4 Drawing Sheets

INTEGRATED CIRCUIT PACKAGE TESTING

FIELD OF THE INVENTION

The disclosure generally relates to testing of integrated circuit packages.

BACKGROUND

In stacked silicon interconnect technology, multiple integrated circuit (IC) dice are stacked, and the signals between the dice and signals input to and output from the packages are transmitted using multiple levels of interconnects. In an example package, an interposer is mounted on a package substrate, and one or more application ICs are mounted on the interposer. Such application ICs may be application specific integrated circuits (ASICs) or programmable ICs such as processors and programmable logic devices, for example.

The IC dice may be mounted on the interposer with copper pillars, the interposer may be mounted on the package substrate with C4 solder bumps, and the package substrate may have a ball grid array for connecting to a printed circuit board, for example. The interconnect between the IC dice and the interposer (e.g., the copper pillars) may be referred to as the level 0 interconnect, the interconnect between the interposer and the package substrate may be referred to as the level 1 interconnect, and the solder bumps for connecting the package substrate to an application substrate may be referred to as the level 2 interconnect. The three levels of interconnects present reliability challenges. Examples include failure of the level 0 interconnects due to metallurgical changes, delamination of the level 1 interconnects leading to bridging of the solder bumps, and stress induced cracks in the level 2 interconnects.

Reliability testing of an IC package having stacked dice can be challenging since different test apparatus are used to test the level 0, 1, and 2 interconnects. In one approach, the package is placed in a test chamber in which environmental parameters such as temperature and humidity can be controlled. After subjecting the package to the desired environmental conditions for the desired period of time, component level testing is performed on the package by removing the package from the test chamber and connecting the ball grid array of the package to probes of a test platform. The test platform transmits and receives signals via the probes, package substrate, and interposer to the IC dice of the package. This effectively tests the level 0 and level 1 interconnects. However, this approach does not replicate the level 2 interconnect as the ball grid array would be connected to a printed circuit board in a system end product.

In another approach, the interposer and IC dice are mounted on a daisy chain substrate instead of the package substrate that would be used in an end product, and the resulting package is mounted on a board level reliability (BLR) test board. After subjecting the package to the desired environmental conditions for the desired period of time, the package is removed from the test chamber, and probes of the test platform are connected to probe pads on the BLR test board. The test platform transmits and receives signals via the probes and daisy chain substrate. The BLR test board approach tests the reliability of the level 2 interconnects in a structure similar to the package being situated in an end product. However, the BLR testing does not test the reliability of the IC dice and interposer.

SUMMARY

In one embodiment, a circuit arrangement includes an integrated circuit (IC) package that includes a package substrate, an interposer mounted directly on the package substrate with level 1 interconnects, and at least one IC die mounted directly on the interposer with level 0 interconnects. The package substrate of the IC package is mounted directly on a connector board with a soldered ball grid array of level 2 interconnects. The level 0, level 1, and level 2 interconnects include respective power, configuration, and test interconnects, and the connector board includes power, configuration, and test terminals coupled to the respective power, configuration, and test interconnects of the level 2 interconnects.

In another embodiment, a method of testing a circuit arrangement includes mounting an integrated circuit (IC) package on a connector board. The IC package includes a package substrate, an interposer mounted directly on the package substrate with level 1 interconnects, and at least one IC die mounted directly on the interposer with level 0 interconnects. The IC package is mounted directly on the connector board with level 2 interconnects; the level 0, level 1, and level 2 interconnects include respective power, configuration, and test interconnects; and the connector board includes power, configuration, and test terminals coupled to the respective power, configuration, and test interconnects of the level 2 interconnects. The method further includes placing the connector board and the mounted IC package in an environmental test chamber and operating the environmental test chamber with the connector board and the mounted IC package situated therein. The connector board is connected to a translator card. The translator card has a first set of connectors and a second set of connectors. The connectors of the first set are connected to the power, configuration, and test terminals of the connector board, and the connectors of the second set are configured and physically arranged for connection to a test platform. The translator card is connected to a test platform, and the level 0, level 1, and level 2 interconnects are thereafter tested.

Other features will be recognized from consideration of the Detailed Description and Claims, which follow.

BRIEF DESCRIPTION OF THE DRAWINGS

Various aspects and features of the test apparatus and methods will become apparent upon review of the following detailed description and upon reference to the drawings in which.

DETAILED DESCRIPTION OF THE DRAWINGS

In the disclosed apparatus and methods, a connector board and translator card are used in combination with an IC package to test reliability of the level 0, 1, and 2 interconnects as well as the functionality of the IC dice of the package. The connector board and translator card may also be structured for in situ testing, that is testing while the package is disposed within the test chamber.

In an example apparatus, an integrated circuit (IC) package includes a package substrate, an interposer mounted directly on the package substrate with level 1 interconnects, and at least one IC die mounted directly on the interposer with level 0 interconnects. The package substrate of the IC package is mounted directly on a connector board with a soldered ball grid array of level 2 interconnects. The level 0, level 1, and level 2 interconnects include respective power, configuration, and test interconnects for testing the IC die, and the connector board includes power, configuration, and test terminals coupled to the respective power, configuration, and test interconnects of the level 2 interconnects. A translator card has two sets of connectors. The connectors of the first set are connected to the power, configuration, and test terminals of the connector board, and the connectors of the second set are configured and physically arranged for connection to a test platform. The IC package and connector board may be subjected to desired environmental conditions, and the connections between the package and the translator card and the connections provided by the translator card to a test platform allow either in situ or ex situ testing of the package.

The separate translator card keeps the environmental effects imposed on the package and connector board from affecting the translator card. End product reliability of the package and connections to the connector board can be tested without introducing possible complications from the environmental conditions to the translator card.

In an alternative implementation, the connector board and translator card may be implemented on a single board instead of two separate boards.

Figure 1:
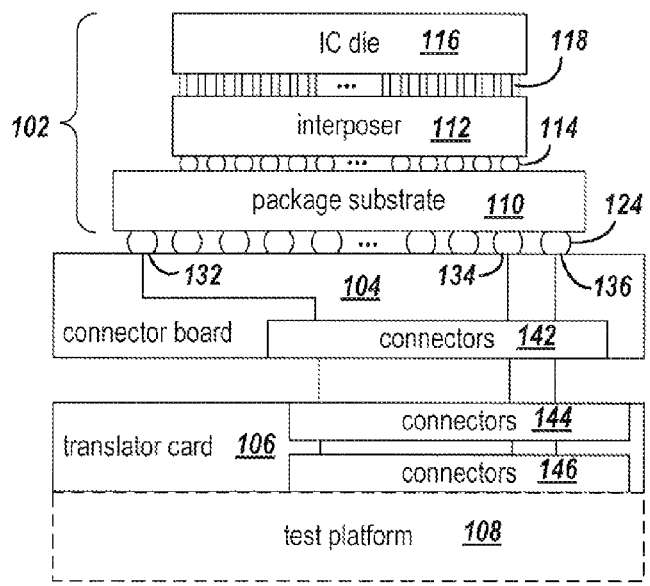
FIG. 1 illustrates an IC package mounted on a connector board, which in turn is connected to a translator card that can be connected to a test platform.

FIG. 1 illustrates an IC package 102 mounted on a connector board 104, which in turn is connected to a translator card 106 that can be connected to a test platform 108. The IC package 102 includes a package substrate 110, an interposer 112 mounted directly on the package substrate with level 1 interconnects 114, and at least one IC die 116 mounted directly on the interposer with level 0 interconnects 118. In an example implementation, the IC die may be a field programmable gate array (FPGA) or a system on a chip having programmable logic. The package 102 is mounted directly on the connector board 104 with level 2 interconnects 124. In an example implementation, the level 0 interconnects are copper pillars, the level 1 interconnects are solder bumps, and the level 2 interconnects comprise a soldered ball grid array.

The level 0, level 1, and level 2 interconnects include respective power, configuration, and test interconnects, and the connector board includes power, configuration, and test terminals coupled to the respective power, configuration, and test interconnects of the level 2 interconnects. For example, terminals 132, 134, and 136 are connected to the power, configuration, and test interconnects of the level 2 interconnects. The level 0 interconnects 118 and level 1 interconnects 114 similarly include respective power, configuration, and test interconnects but are not individually labelled. The level 2 power, configuration, and test interconnects are coupled through the connector board to connectors 142.

The connector board 104 is coupled to the translator card 106 by way of connectors 142 on the connector board and connectors 144 on the translator card. The connectors 144 of the translator card are coupled to the power, configuration, and test terminals 132, 134 and 136 of the connector board. Wiring of the translator card couples connectors 144 to the connectors 146. Connectors 146 are configured and physically arranged for connection to test platform 108. The connector board and translator card are printed circuit boards in an example implementation. In an example implementation, the connectors 142, 144, and 146 may include a combination of surface mount, through-hole, spring loaded, pin grid array, edge, and/or mezzanine connectors. The connectors may be rigid or flexible.

The connector board 104 provides reliability test access to the IC die 116, which may be an ASIC, a system on a chip (SOC), or other programmable IC. The package substrate 110 may be a standard product substrate instead of the daisy chain substrate in prior approaches. Access to the interconnects that provide power, configuration, and test signals to the IC die is provided by the connectors 142 of connector board. The translator card 106 provides the interface to standard test platforms such as automated test equipment. With the translator card and connector board, the IC die can be accessed for component level testing with the package mounted on a board as it would be in an end product. In addition, since the level 2 interconnects are used for powering up and configuring the IC die, interconnect failures at level 2 can be identified. Standard product packages and packages that have been functionally rejected can be used as the package 102 for reliability testing, thereby eliminating the need for special substrates.

Figure 2:
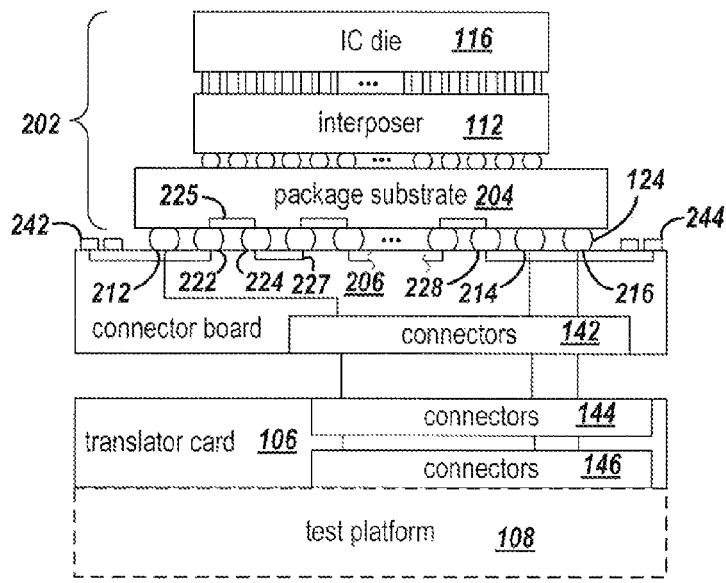
FIG. 2 illustrates another circuit arrangement for reliability testing.

FIG. 2 illustrates another circuit arrangement for reliability testing. The circuit arrangement allows for either in situ or ex situ testing of the package and connector board. Though the circuit arrangement of FIG. 1 is effective in testing the reliability of the IC die 116, testing with the arrangement of FIG. 1 involves removing the connector board 104 and package 102 from the test chamber at regular intervals to test the reliability. This means a failure could be missed if the package and board are not tested at the right time.

In the circuit arrangement of FIG. 2, the package substrate 204 and connector board 206 are structured to allow monitoring of the level 2 interconnects 124 while the package 202 and connector board 206 are in situ. The connections that are not for power, configuration, or test signals are connected in a daisy chain in the package substrate 204 and the connector board 206. For example, connections 212, 214, and 216 are for power, configuration, and test signals as described above. The other connections, for example, connections 222, 224, and 228 are connected in a daisy chain by signal lines (e.g., 225, 227) in the package substrate 204 and connector board 206. The daisy chain can be used for in situ monitoring of large resistance changes in the level 2 interconnect. For example, test probes (not shown) can be connected to probe pads 242 and 244 to monitor the resistance of the daisy chain that includes connections 222, 224 and 228 while the package and connector board are in situ. For reliability testing of the level 0 and level 1 interconnects, the package and connector board may be removed from the test chamber and connected to the translator card 106 and test platform 108 as described above.

Figure 3:
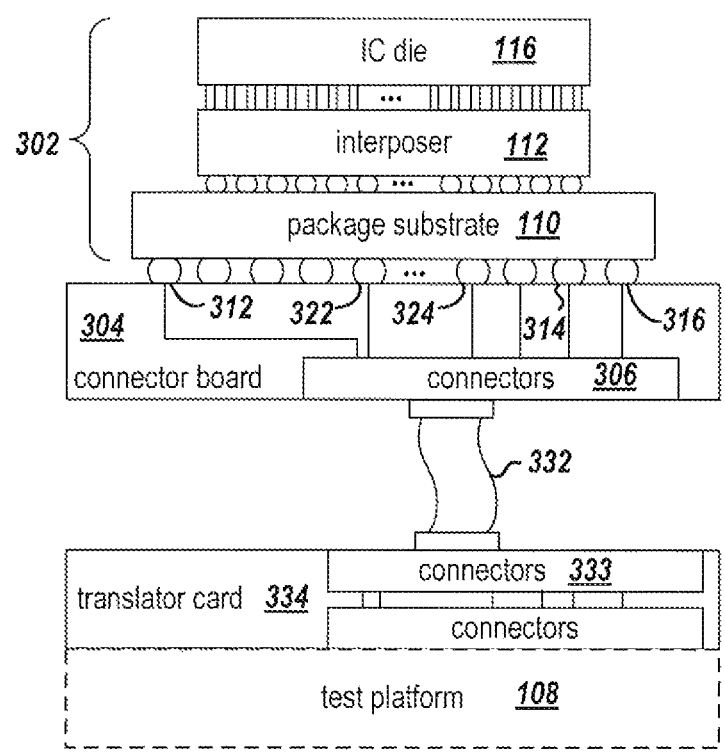
FIG. 3 illustrates a circuit arrangement that may be used for in situ testing of both the package and board level reliability.

FIG. 3 illustrates a circuit arrangement that may be used for in situ testing of both the package 302 and board level reliability. The package substrate 110 may be a standard product substrate, and the connector board 304 includes connectors 306 that are structured for in situ monitoring. Terminals 312, 314, and 316 provide power, configuration, and test signals between the connectors 306 and the package 302. In addition, other terminals, such as terminals 322 and 324, of the connector board are connected to other input/output (I/O) terminals of the package. Cable 332 connects the translator card 334 to the connector board. Connectors 306 and 333 may be pin type connectors such as those used in computer hardware, and cable 332 may be a bus type flexible cable.

The connection between the translator card 334 and the connector board, as provided by cable 332, supports in situ testing of the package 302 and connector board 304. The test platform 108 may be a parametric test system, for example, and DC parametric tests such as DCIO, open, short, and leakage may be used to capture minor resistance changes in situ.

Figure 4:
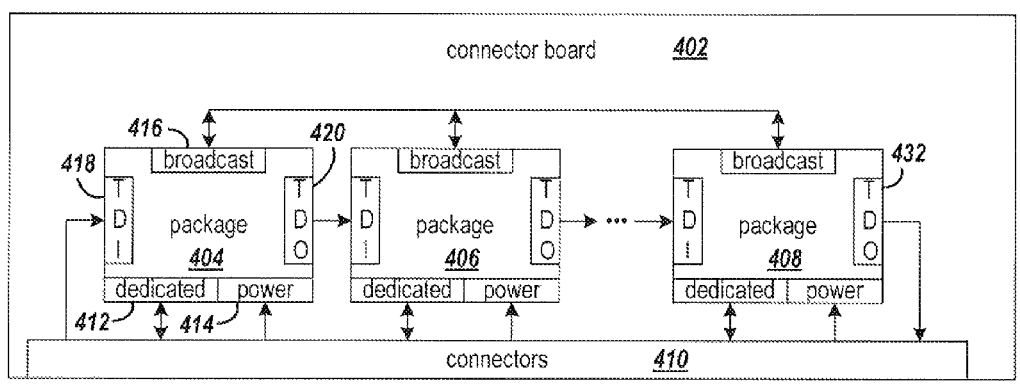
FIG. 4 illustrates a connector board on which multiple packages are mounted.

FIG. 4 illustrates a connector board 402 according to an example implementation in which multiple packages 404, 406, and 408 are mounted on the connector board. The packages and connector board may be structured as in any of the circuit arrangements of FIG. 1, 2, or 3. The connector board includes connectors 410, which correspond to the connectors 142 and 306 in FIGS. 1, 2, and 3 for connecting to the translator card.

Each package has respective terminals for dedicated signals, such as terminals 412 of package 404, respective terminals for power, such as terminals 414 of package 404, respective terminals for broadcasting signals between packages over the connector board, such as terminals 416 of package 404, and respective boundary scan terminals, such as terminals 418 and 420 of package 404. On each of the packages, the terminals for the dedicated signals and power are connected to the connectors 410. In addition, the boundary scan input terminal 418 of the first package 404 in the scan chain and the boundary scan output terminal 432 of the last package in the scan chain are connected to the connectors 410.

Figure 5:
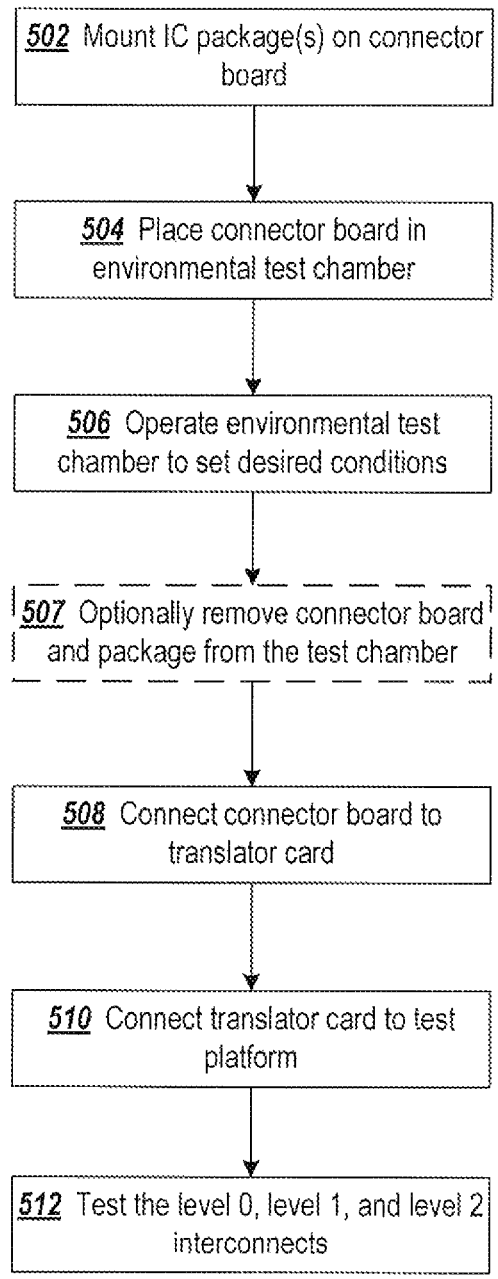
FIG. 5 is a flowchart of a process for testing an IC package using the connector board and translator card of FIGS. 1-4.

FIG. 5 is a flowchart of a process for testing an IC package using the connector board and translator card of FIGS. 1-4. At block 502, one or more IC packages are mounted on a connector board. The IC package(s) is attached to the connector board in the same manner an end user would mount the package to a board that is to be used in the user's end product.

At block 504, the board having the package(s) mounted thereon is placed in an environmental test chamber, and the test chamber is operated to subject the board and package(s) to desired environmental conditions at block 506. Depending on the structure of the connector board and IC package(s) and the type of test being performed, the connector board may be connected to a translator card either before the board and package(s) are placed in the test chamber for in situ testing, or after the board and package(s) are removed from the chamber for ex situ testing at specified intervals. Similarly, the translator card can be connected to a test platform either while the board and package(s) are within the chamber or after the board and package(s) are removed from the chamber. Optionally, the connector board and package may be removed from the environmental test chamber at block 507. The connecting of the board to the translator card is shown at block 508, and the connecting of the translator card to a test platform is shown at block 510. At block 512 the level 0, level 1, and level 2 interconnects are tested. The testing may be performed either in situ or ex situ, depending on the structure of the connector board and attached package(s). For in situ testing, the board and package(s) remain in the test chamber while power and configuration and test signals are applied. For ex situ testing, the board and package(s) are removed from the test chamber before applying power and configuration and test signals. In an example implementation, the test platform applies power to the terminal of the connector on the translator card that is connected to the power terminal of the connector board and IC package. The test platform further inputs configuration data to the terminal of the connector on the translator card that is connected to the configuration terminal of the connector board and IC package. Test signals may be further applied to the proper terminals. If the test platform receives the expected response from the IC package, component-level reliability is verified.

The connector board and package substrate may include additional terminals that are connected in a daisy chain. The additional terminals are in addition to the terminals used for power, configuration, and test signals. The ends of the daisy chain of terminals may be connected to probe pads of the connector board. The level 2 interconnect may be tested by connecting probes to the probe pads and monitoring for changes in resistance.

Though aspects and features may in some cases be described in individual figures, it will be appreciated that features from one figure can be combined with features of another figure even though the combination is not explicitly shown or explicitly described as a combination.

The circuits and methods are thought to be applicable to a variety of systems for reliability testing of IC packages. Other aspects and features will be apparent to those skilled in the art from consideration of the specification. It is intended that the specification and drawings be considered as examples only, with a true scope of the invention being indicated by the following claims.

What is claimed is:

1. A circuit arrangement, comprising:
   an integrated circuit (IC) package that includes a package substrate, an interposer mounted directly on the package substrate with level 1 interconnects, and at least one IC die mounted directly on the interposer with level 0 interconnects;
   a connector board, wherein the package substrate of the IC package is mounted directly on the connector board with a soldered ball grid array of level 2 interconnects;
   wherein the level 0, level 1, and level 2 interconnects include respective power, configuration, and test interconnects, and the connector board includes power, configuration, and test terminals coupled to the respective power, configuration, and test interconnects of the level 2 interconnects; and
   a translator card having a first set of connectors and a second set of connectors, wherein the connectors of the first set are connected to the power, configuration, and test terminals of the connector board, and the connectors of the second set are configured and physically arranged for connection to a test platform;
   wherein the level 2 interconnects include a plurality of interconnects other than the respective power, configuration, and test interconnects, and the package substrate includes a daisy chain connection between the plurality of interconnects.

2. The circuit arrangement of claim 1, wherein the connector board includes a set of connectors configured and physically arranged for connection to a test platform.

3. The circuit arrangement of claim 1, wherein the connector board includes a daisy chain connection between the plurality of interconnects.

4. The circuit arrangement of claim 1, wherein:
   the level 2 interconnects include a plurality of interconnects other than the respective power, configuration, and test interconnects;
   the connector board includes a plurality of terminals other than the power, configuration, and test terminals, and the connector board includes connections between the plurality of terminals and the plurality of interconnects; and
   the first set of connectors of the translator card is connected to the power, configuration, and test terminals and to the plurality of terminals of the connector board with at least one cable.

5. The circuit arrangement of claim 1, wherein the level 0 interconnects are copper pillars.

6. The circuit arrangement of claim 1, wherein the level 1 interconnects are solder bumps.

7. The circuit arrangement of claim 1, further comprising a plurality of IC packages mounted on the connector board.

8. The circuit arrangement of claim 7, wherein the plurality of IC packages are coupled in a scan chain on the connector board.

9. A method of testing a circuit arrangement, comprising:
mounting an integrated circuit (IC) package on a connector board, wherein:
the IC package includes a package substrate, an interposer mounted directly on the package substrate with level 1 interconnects, and at least one IC die mounted directly on the interposer with level 0 interconnects;
the IC package is mounted directly on the connector board with level 2 interconnects;
the level 0, level 1, and level 2 interconnects include respective power, configuration, and test interconnects;
the connector board includes power, configuration, and test terminals coupled to the respective power, configuration, and test interconnects of the level 2 interconnects;
placing the connector board having the IC package mounted thereon in an environmental test chamber;
operating the environmental test chamber with the connector board having the IC package mounted thereon situated therein;
connecting the connector board to a translator card, wherein:
the translator card has a first set of connectors and a second set of connectors;
the connectors of the first set are connected to the power, configuration, and test terminals of the connector board;
the connectors of the second set are configured and physically arranged for connection to a test platform;
connecting the translator card to the test platform; and
testing the level 0, level 1, and level 2 interconnects.

10. The method of claim 9, wherein the testing includes:
applying power to the at least one IC die; and
inputting configuration data to the at least one IC die via the configuration interconnect.

11. The method of claim 9, wherein the level 2 interconnects include a plurality of interconnects other than the respective power, configuration, and test interconnects, and the package substrate includes a daisy chain connection between the plurality of interconnects, the method further including:
testing the plurality of level 2 interconnects.

12. The method of claim 9, wherein the testing of the at least one IC die is performed while the connector board having the IC package mounted thereon are in the environmental test chamber.

13. The method of claim 9, further comprising:
removing the connector board having the IC package mounted thereon from the environmental test chamber;
wherein the connecting of the translator card to the connector board is performed after removing the connector board having the IC package mounted thereon from the environmental test chamber; and
wherein the testing is performed while the connector board having the IC package mounted thereon are outside the environmental test chamber.

14. The method of claim 13, further comprising:
mounting a plurality of IC packages on the connector board; and
connecting the plurality of IC packages in a scan chain on the connector board.

15. The method of claim 9, wherein the level 0 interconnects are copper pillars.

16. The method of claim 9, wherein the level 1 interconnects are solder bumps.

17. The method of claim 9, further comprising mounting a plurality of IC packages on the connector board.

18. The method of claim 17, further comprising connecting the plurality of IC packages in a scan chain on the connector board.

* * * * *